United States Patent
Oki

(10) Patent No.: US 6,920,224 B2
(45) Date of Patent: Jul. 19, 2005

(54) DEEP BASS SOUND BOOSTER DEVICE

(75) Inventor: Takashi Oki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 287 days.

(21) Appl. No.: 09/976,025

(22) Filed: Oct. 15, 2001

(65) Prior Publication Data
US 2002/0048378 A1 Apr. 25, 2002

(30) Foreign Application Priority Data
Oct. 20, 2000 (JP) .......................... 2000-321123

(51) Int. Cl.[7] .......................... H02B 1/00; H03G 5/00; H04R 1/10; H04R 5/02
(52) U.S. Cl. .......................... 381/123; 381/74; 381/309
(58) Field of Search .......................... 381/98, 99, 100, 381/101, 123, 1, 17, 27, 309, 74, 310

(56) References Cited

U.S. PATENT DOCUMENTS

| | | | | |
|---|---|---|---|---|
| 4,739,514 A | * | 4/1988 | Short et al. | 381/103 |
| 4,980,915 A | * | 12/1990 | Ishikawa | 381/27 |
| 5,581,626 A | * | 12/1996 | Palmer | 381/103 |
| 6,285,767 B1 | * | 9/2001 | Klayman | 381/17 |

FOREIGN PATENT DOCUMENTS

GB 2153187 A * 8/1985 ............ H04R/5/04

* cited by examiner

Primary Examiner—Sinh Tran
Assistant Examiner—Devona E Faulk
(74) Attorney, Agent, or Firm—Morgan, Lewis & Bockius LLP

(57) ABSTRACT

A deep bass sound booster device comprises a high-pass filter to which an input sound signal is fed and which permits only a frequency component higher than a predetermined frequency to pass through so as to output a resulting signal, a bass booster to which the input sound signal is fed and which amplifies only a frequency component lower than the predetermined frequency and attenuates another frequency component so as to output a resulting signal, a switch to which the signal output from the bass booster is fed at one end and which, when turned on, outputs that signal at another end, and an adder to which the signal output from the high-pass filter is fed and to which the signal output from the switch is fed, the adder adding together those two signals and outputting a resulting signal.

4 Claims, 4 Drawing Sheets

DEEP BASS SOUND BOOSTER DEVICE

BACKGROUND OF THE INVENTION

1. Field of the Invention

The present invention relates to a deep bass sound booster device that reproduces a powerful sound having emphasized bass.

2. Description of the Prior Art

FIG. 7 shows a block diagram of a conventional deep bass sound booster device. Bass boosters 101 and 201, having a gain-frequency relationship as shown in FIG. 8, amplify a predetermined frequency band.

When sound is reproduced with headphones through output terminals $H_L$ and $H_R$, a bass-frequency sound is depressed due to structure of the headphones. Therefore, it is necessary to compensate this with a pre-arranged gain-frequency property. When headphones are used, this is achieved by selecting a property of the bass boosters 101 and 201 as shown in FIG. 8 with a microprocessor or the like used in a system having a deep bass sound booster device. When loudspeakers are used, a property shown in FIG. 6 is selected.

When reproducing the sound with loudspeakers, left-channel and right-channel stereo signals that are fed through input terminals $IN_L$ and $IN_R$ from a sound source are input to high-pass filters 102 and 202 after passing through the bass boosters 101 and 201 respectively. When reproducing the sound with headphones, the stereo signals are reproduced with left and right headphones that are connected to the output terminals $H_L$ and $H_R$ respectively without passing through the high-pass filters 101 and 202.

Each of the high-pass filters 102 and 202 has a gain-frequency relationship as shown in FIG. 3 and permits only a frequency component higher than a cutoff frequency fc (e.g. 100 Hz) to pass through when signals are fed from the bass boosters 101 and 201. The signals output from the high-pass filters 102 and 202 are converted into audio sounds with left and right mid- to high-range loudspeakers that are connected to output terminals $S_L$ and $S_R$ respectively.

An adder 301 outputs signals after adding the left-channel and right-channel stereo signals together that are fed to the input terminals $IN_L$ and $IN_R$ respectively from the sound source. A bass booster 302, having a gain-frequency relationship as shown in FIG. 4, amplifies a predetermined frequency band T and attenuates another frequency band in the signals that are fed from the adder 301 before feeding out as a resulting signal. The signal output from the bass booster 302 is then converted into an audio sound with a bass (low-range) loudspeaker that is connected to an output terminal $S_B$.

As described above, when the headphones are used, the gain-frequency relationship between the reproduced sound and the sound source will be such a curve as shown in FIG. 8. When the loudspeakers are used, the gain-frequency relationship will be such a curve as shown in FIG. 5. In either case, it is possible to reproduce a powerful audio sound having emphasized bass.

However, according to the aforementioned conventional deep bass sound booster device, it is necessary to arrange individual bass boosters, for example, the bass boosters 101 and 201 for outputting to headphones and the bass booster 302 for outputting to loudspeakers. As a result, this requirement causes an increase in circuit size and cost.

SUMMARY OF THE INVENTION

An object of the present invention is to provide a deep bass sound booster device that can be made smaller in size and economically.

To achieve the above object, according to one aspect of the present invention, a deep bass sound booster device comprises, a high-pass filter to which an input sound signal is fed and which permits only a frequency component higher than a predetermined frequency to pass through so as to output a resulting signal, a bass booster to which the input sound signal is fed and which amplifies only a frequency component lower than the predetermined frequency and attenuates another frequency component so as to output a resulting signal, a switch to which the signal output from the bass booster is fed at one end and which, when turned on, outputs that signal at another end, and an adder to which the signal output from the high-pass filter is fed and to which the signal output from the switch is fed, the adder adding together those two signals and outputting a resulting signal.

In this structure, when the switch is turned on, the sound source signal is processed so that the resulting signal output from the adder, as shown in FIG. 5, includes a signal consisting of amplified low-range frequencies and attenuated mid- to high-range frequencies and a signal consisting of attenuated low-range frequencies. On the other hand, when the switch is turned off, the resulting signal output from the adder includes a signal consisting of amplified low-range frequencies and attenuated mid- to high-range frequencies.

Therefore, when headphones that are connected to an output side of the adder are used to reproduce an audio sound, the switch is turned on. Instead, when mid- to high-range loudspeakers that are connected to the output side of the adder and a bass loudspeaker that is connected to an output side of the bass booster are used to reproduce an audio sound, the switch is turned off. In this way, a single bass booster can be shared between headphones and loudspeakers so as to reproduce a powerful audio sound having emphasized bass.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Hereinafter, embodiments of the present invention will be described with reference to the accompanying drawings.

Figure 1:
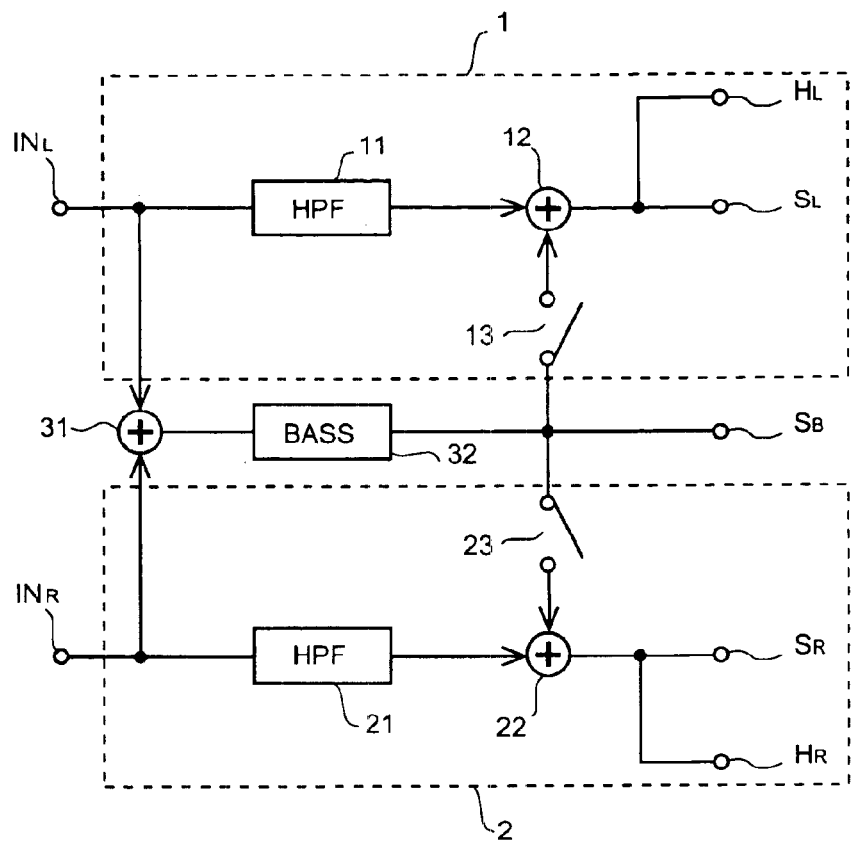
FIG. 1 is a block diagram showing a deep bass sound booster device of a first embodiment of the invention.
Figure 3:
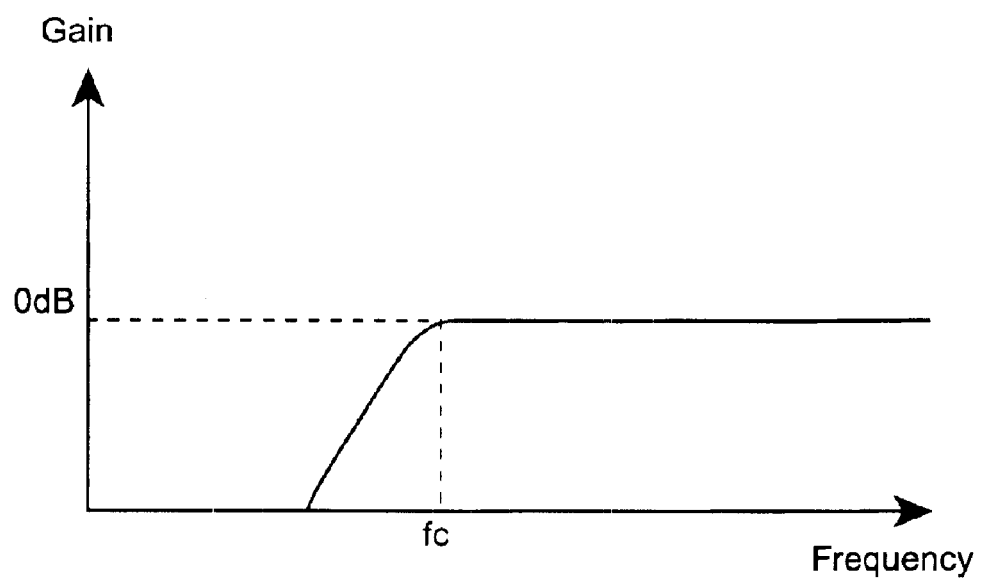
FIG. 3 is a chart showing a gain-frequency relationship of a high-pass filter shown in FIG. 1.

FIG. 1 is a block diagram showing a deep bass sound booster device of a first embodiment of the present invention. Processing blocks 1 and 2 are blocks for processing left-channel and right-channel mid- to high-range audio signals respectively. Each of high-pass filters 11 and 21 has a gain-frequency relationship as shown in FIG. 3 and permits only a frequency component higher than a cutoff frequency fc (e.g. 100 Hz) to pass through when signals are fed from input terminals $IN_L$ and $IN_R$ respectively. The signals output from the high-pass filters 11 and 21 are then fed to adders 12 and 22 respectively.

Figure 4:
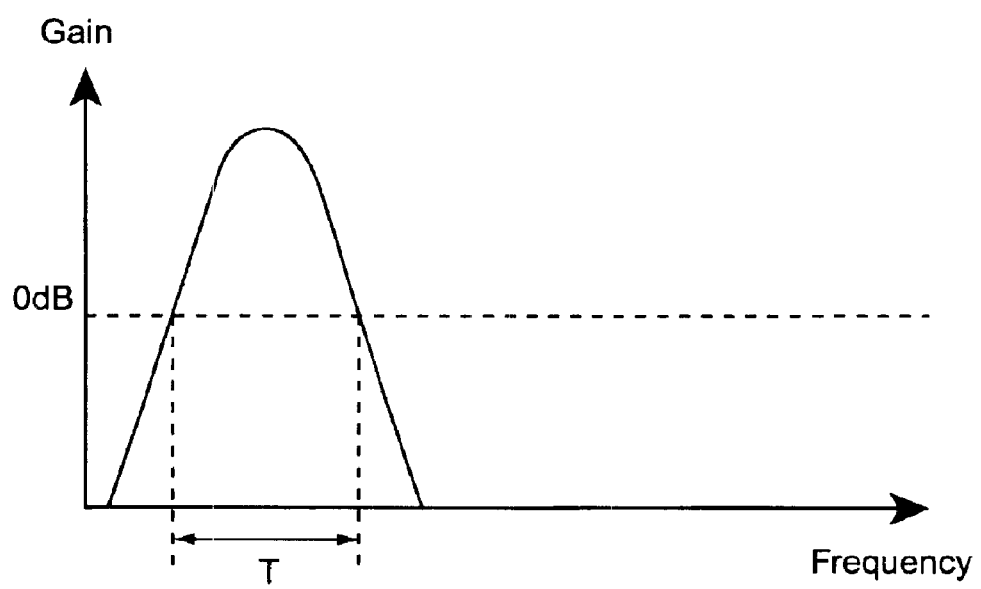
FIG. 4 is a chart showing a gain-frequency relationship of a bass booster shown in FIG. 1.

An adder 31 outputs a resulting signal after adding together the left-channel stereo signal that is fed to the input terminal $IN_L$ from a sound source and the right-channel stereo signal that is fed to the input terminal $IN_R$ from the sound source. A bass booster 32, having a gain-frequency relationship as shown in FIG. 4, outputs a signal after amplifying a frequency component in a predetermined frequency band T and attenuating another frequency component when the signal output from the adder 31 is fed in. The signal output from the bass booster 32 is then fed to adders 12 and 22 after passing through switches 13 and 23 respectively. Furthermore, an output side of the bass booster 32 is connected to an output terminal $S_B$ to which a bass (low-range) loudspeaker is to be connected.

An output side of the adder 12 is connected to an output terminal $S_L$ to which a left-channel mid- to high-range loudspeaker is to be connected and is also connected to an output terminal $H_L$ to which a left-channel headphone is to be connected. An output side of the adder 22 is connected to an output terminal $S_R$ to which a right-channel mid- to high-range loudspeaker is to be connected and is also connected to an output terminal $H_R$ to which a right-channel headphone is to be connected.

Figure 5:
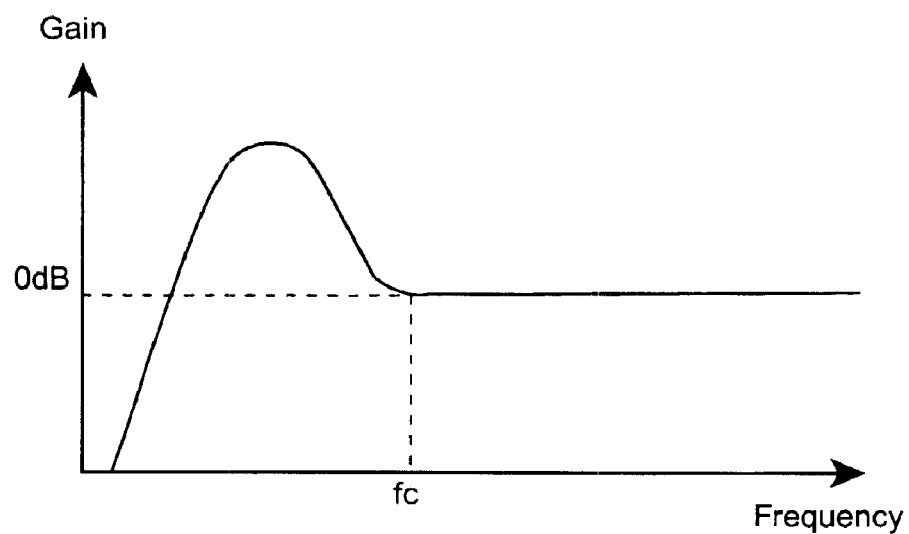
FIG. 5 is a chart showing a gain-frequency relationship of the sound reproduced with the deep bass sound booster device.

In this structure, each related property is designed so that substantially an identical property curve as shown in FIG. 5 is realized when a gain-frequency curve of the high-pass filter 11 or 21 as shown in FIG. 3 and that of the bass booster 32 as shown in FIG. 4 are added together.

According to the structure as described above, when the switches 13 and 23 are turned on, a signal output from the adder 12 becomes a sum of combined signals that are output from the high-pass filter 11 and the bass booster 32. At the same time, a signal output from the adder 22 becomes a sum of combined signals that are output from the high-pass filter 21 and the bass booster 32. On the other hand, when said switches are turned off, the adders 12 and 22 output only those signals that are fed from each of the high-pass filters 11 and 21.

As a result, if a system having the deep bass sound booster device is designed so as to turn on the switches 13 and 23 by switching means when headphones are connected to the output terminals $H_L$ and $H_R$, and to turn off the switches 13 and 23 by the switching means when mid- to high-range loudspeakers and a bass loudspeaker are connected to the output terminals $S_L$, $S_R$, and $S_B$ respectively, it becomes possible to reproduce a powerful sound having emphasized bass because a similar acoustic gain-frequency relationship as shown in FIG. 5 is realized in both cases. Said switching means includes using, for example, a microprocessor and switching transistors or the like provided in the system in which the deep bass sound booster device of the present invention is mounted. Another example of the switching means includes using mechanical or electrical contacts provided by jacks or connectors used for connecting the headphones or loudspeakers, or using manually operated switches provided in the system. In this embodiment, a single bass booster 32 that is shared between outputs to the headphones and loudspeakers contributes to realizing a compact circuit and an economical device.

Figure 6:
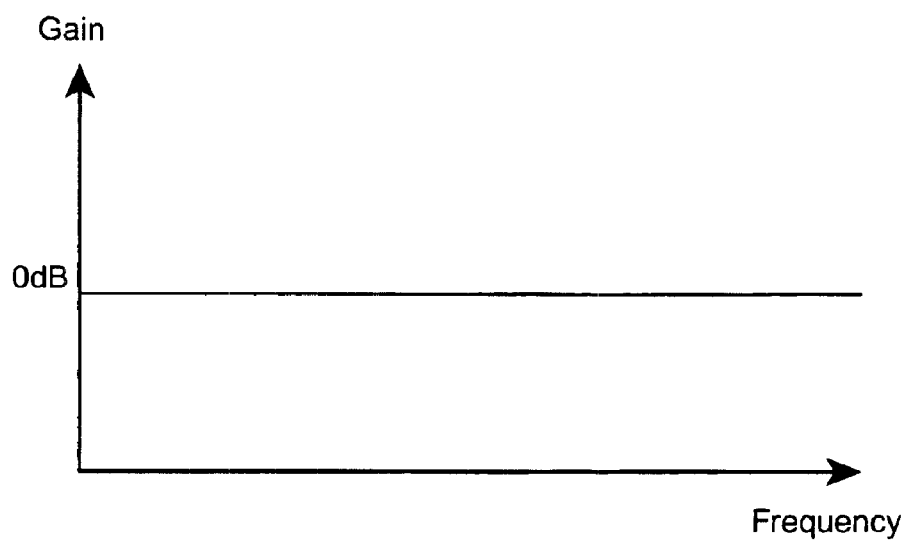
FIG. 6 is a chart showing another gain-frequency relationship of the high-pass filter shown in FIG. 1.
Figure 7:
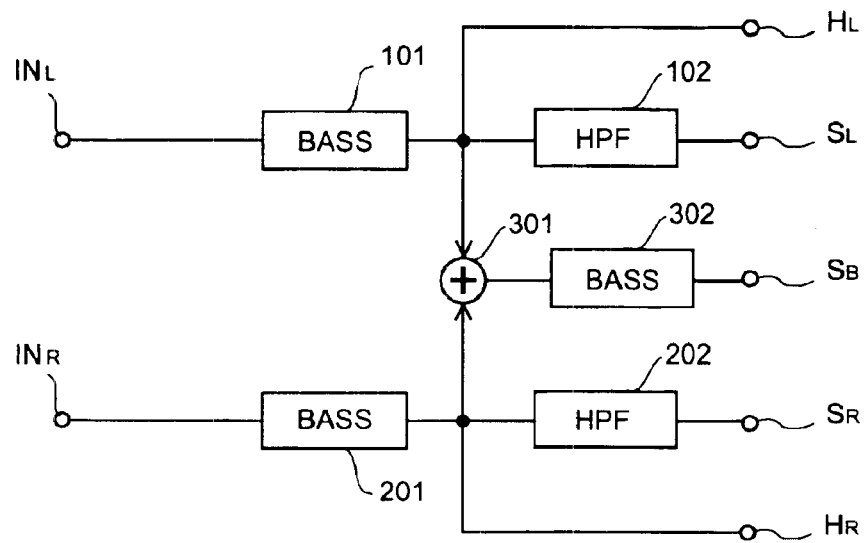
FIG. 7 is a block diagram showing a conventional deep bass sound booster device.
Figure 8:
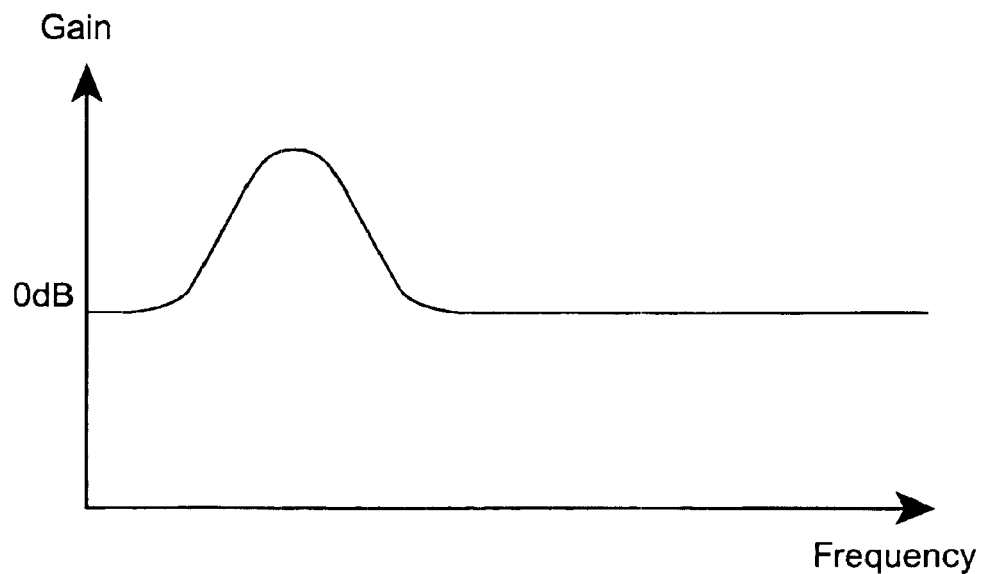
FIG. 8 is a chart showing a gain-frequency relationship of the conventional deep bass sound booster.

Furthermore, in the above-mentioned embodiment, if an adjustable input level to the bass booster 32 is required, the device can be configured with a buffer circuit so as to arrange the high-pass filters 11 and 21 to have an additional flat gain-frequency relationship (zero gains regardless of frequencies) as shown in FIG. 6. In this configuration, it is desirable for the device to switch over to the flat gain-frequency relationship curve when the input level to the bass booster 32 is muted while reproducing sound with headphones. It is, therefore, possible to prevent an uncomfortable problem of an acoustic sound without bass from being reproduced with headphones, which is caused otherwise when the input level is adjusted too low.

On the other hand, in the above-described case when using loudspeakers, it is also possible to arrange the device for limiting the adjustable input level so as to prevent the bass signal that is output from the bass booster 32 from falling below the input level. In this arrangement, it is also possible to prevent the uncomfortable problem of an acoustic sound without bass from being reproduced, without arranging and switching to an additional property of the high-pass filters 11 and 21 in accordance with the input level adjusted and given to the bass booster 32.

Figure 2:
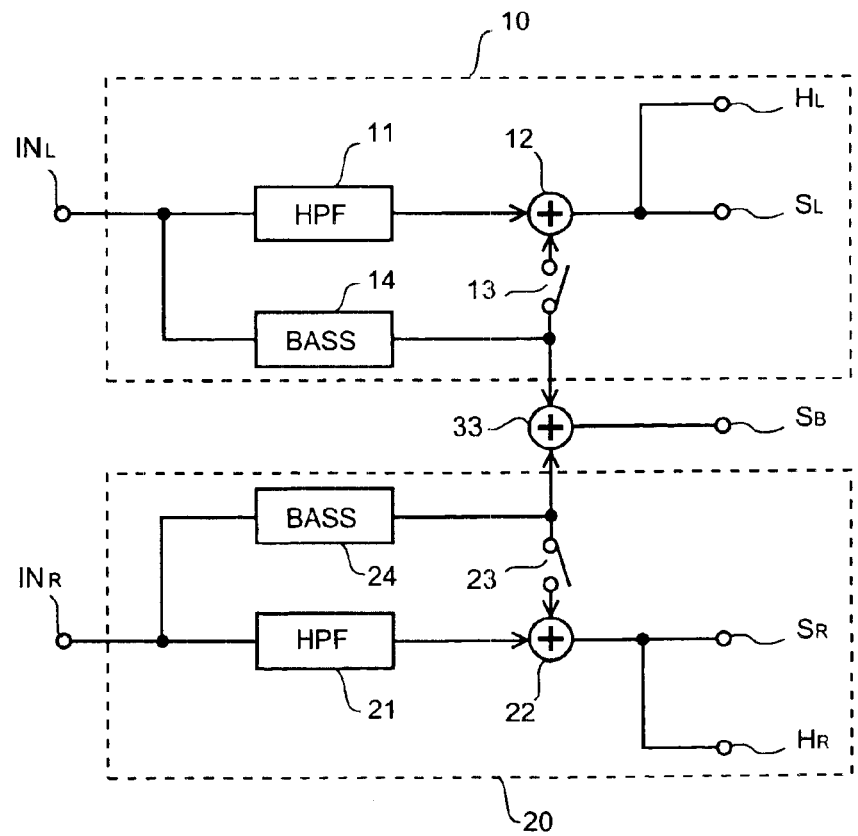
FIG. 2 is a block diagram showing a deep bass sound booster device of a second embodiment of the invention.

FIG. 2 is a block diagram showing a deep bass sound booster device of a second embodiment of the invention. As shown in FIG. 2, processing blocks 10 and 20 are blocks for processing left-channel and right-channel mid- to high-range audio signals respectively. It is also possible to arrange the device so that the right and left channels have individual bass boosters 14 and 24 (the same bass booster as used for the bass booster 32 in FIG. 1) so as to output a bass sound with a bass loudspeaker after an adder 33 adds together the signals output from the bass boosters 14 and 24. In this embodiment, headphones can reproduce a powerful sound with high fidelity, because each individual bass signal in the left and right channels is reproduced without being added together.

In the case in which a sound source is limited to a monaural signal, such a device as shown in FIG. 1 but excluding the filter 11 (or 21), the adder 12 (or 22), the switch 13 (or 23), and the adder 31 is also possible.

As previously described, according to the deep bass sound booster device in the present invention, a single bass booster is shared between loudspeakers and headphones, thereby contributing to realizing a reduced circuit size and cost.

What is claimed is:

1. A deep bass sound booster device, that receives left-channel and right-channel input sound signals and performs sound reproduction therefrom in stereo when one of reproduction with loudspeakers and reproduction with headphones is selected, comprising:

left-channel and right-channel high-pass filters to which the left-channel and the right-channel input sound signals are fed respectively, the high-pass filters having high-pass characteristics in which only frequency components higher than a predetermined frequency are allowed to pass through for outputting;

left-channel and right-channel bass boosters to which the left-channel and the right-channel input sound signals are fed respectively, amplifying only frequency components lower than the predetermined frequency, and attenuating other frequency components for outputting;

a bass adder for adding output signals from the left-channel bass booster and output signals from the right-channel bass booster together and outputting resultant signals;

a left-channel adder capable of adding two left-channel signals together and outputting resultant signals, the two left-channel signals being output signals from the left-channel high-pass filter and output signals from the left-channel bass booster;

a right-channel adder capable of adding two right-channel signals together and outputting resultant signals, the two right-channel signals being output signals from the right-channel high-pass filter and output signals from the right-channel bass booster;

a left-channel switch having ON and OFF states, arranged between the left-channel adder and an output side of the left-channel bass booster, for forming, in the ON state thereof, a signal path through which the output signals from the left-channel bass booster are fed to the left-channel adder; and a right-channel switch having ON and OFF states, arranged between the right-channel adder and an output side of the right-channel bass booster, for forming, in the ON state thereof, a signal path through which the output signals from the right-channel bass booster are fed to the right-channel adder, wherein, when the reproduction with loudspeakers is selected, the left-channel and the right-channel switches are brought to the OFF state so that the output signals from the left-channel and the right-channel high-pass filters are fed to left and right loudspeakers intact respectively, and output signals of the bass adder are fed to a bass loudspeaker, and, when the reproduction with headphones is selected, the left-channel and the right-channel switches are brought to the ON state so that the two left-channel signals are added together by the left-channel adder so as to be fed to a left side of the headphones, and the two right-channel signals are added together by the right-channel adder so as to be fed to a right side of the headphones.

2. A deep bass sound booster device as claimed in claim 1, further comprising a connector to which the headphones are connected, wherein the connector is provided with the left-channel and the right-channel switches;

when the headphones are connected to the connector, the left-channel and the right-channel switches are brought to the ON state respectively; and when the headphones are disconnected from the connector, the left-channel and the right-channel switches are brought to the OFF state respectively.

3. A deep bass sound booster device as claimed in claim 1, further comprising for adjusting a level of signals fed to the left-channel and the right-channel bass boosters, wherein the left-channel and the right-channel high-pass filters have the high-pass characteristics and flat characteristics of which one can be selected, and when the headphones are used to reproduce sound and when the level of signals fed to the left-channel and the right-channel bass boosters is muted, the flat characteristics are selected, and when the headphones are used to reproduce sound and when the level of signals fed to the left-channel and the right-channel bass boosters is not muted, the high-pass characteristics are selected.

4. A deep bass sound booster device as claimed in claim 3, wherein, when the loudspeakers are used to reproduce sound and when the level of signals fed to the left-channel and the right-channel bass boosters is turned down, the the level of signals fed to the left-channel and the right-channel bass boosters is prevented from being turned down any further when a level of the output signals of the left-channel and the right-channel bass boosters falls below a level of the input sound signals.

* * * * *